(12) United States Patent
Da Costa Assafrao et al.

(10) Patent No.: US 11,009,345 B2
(45) Date of Patent: May 18, 2021

(54) METROLOGY METHOD, APPARATUS, AND COMPUTER PROGRAM TO DETERMINE A REPRESENTATIVE SENSITIVITY COEFFICIENT

(71) Applicant: ASML Netherlands B.V., Veldhoven (NL)

(72) Inventors: Alberto Da Costa Assafrao, Veldhoven (NL); Mohammadreza Hajiahmadi, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/418,235

(22) Filed: May 21, 2019

(65) Prior Publication Data

US 2019/0368867 A1    Dec. 5, 2019

(30) Foreign Application Priority Data

May 29, 2018 (EP) .................... 18174831

(51) Int. Cl.
*G01B 11/27* (2006.01)
*G06N 20/00* (2019.01)
(Continued)

(52) U.S. Cl.
CPC ............ *G01B 11/272* (2013.01); *G01B 11/14* (2013.01); *G03F 7/70633* (2013.01); *G06N 20/00* (2019.01); *G01B 2210/56* (2013.01)

(58) Field of Classification Search
CPC ............ G03F 7/70616; G03F 7/70625; G03F 7/70633; G03F 7/70641; G03F 7/70683;
(Continued)

(56) References Cited

U.S. PATENT DOCUMENTS 10,386,176 B2   8/2019 Bhattacharyya et al.
2003/0223630 A1*  12/2003 Adel ................ G03F 7/70633
                                                   382/145
(Continued)

FOREIGN PATENT DOCUMENTS

EP        3293574 A1    3/2018
TW     201809903 A      3/2018
(Continued)

OTHER PUBLICATIONS

International Search Report and Written Opinion of the International Searching Authority directed to related International Patent Application No. PCT/EP2019/061165, dated Jun. 13, 2019; 13 pages.

*Primary Examiner* — Gordon J Stock, Jr.
(74) *Attorney, Agent, or Firm* — Sterne, Kessler, Goldstein & Fox P.L.L.C.

(57) ABSTRACT

Disclosed is a method of, and associated metrology apparatus for, determining a characteristic of a target on a substrate. The method comprises obtaining a plurality of intensity asymmetry measurements, each intensity asymmetry measurement relating to a target formed on the substrate and determining a sensitivity coefficient corresponding to each target, from the plurality of intensity asymmetry measurements. Using these sensitivity coefficients a representative sensitivity coefficient is determined for said plurality of targets or a subset greater than one thereof. The characteristic of the target can then be determined using the representative sensitivity coefficient.

19 Claims, 6 Drawing Sheets

(51) Int. Cl.
*G03F 7/20* (2006.01)
*G01B 11/14* (2006.01)

(58) Field of Classification Search
CPC ......... G01B 11/14; G01B 11/24; G01B 11/27; G01B 11/272; G01B 2210/56
See application file for complete search history.

(56) References Cited

U.S. PATENT DOCUMENTS

| | | | |
|---|---|---|---|
| 2008/0174753 A1* | 7/2008 | Mos | G01N 21/4738 355/53 |
| 2011/0027704 A1 | 2/2011 | Cramer et al. | |
| 2011/0043791 A1 | 2/2011 | Smilde et al. | |
| 2012/0242970 A1 | 9/2012 | Smilde et al. | |
| 2014/0136137 A1* | 5/2014 | Tarshish-Shapir | G01N 21/4788 702/108 |
| 2015/0177166 A1* | 6/2015 | Cramer | G01N 23/203 355/67 |
| 2016/0161863 A1* | 6/2016 | Den Boef | G01B 11/24 355/67 |
| 2016/0223322 A1* | 8/2016 | Liu | G03F 7/70625 |
| 2016/0291481 A1* | 10/2016 | Smilde | G03F 7/70633 |
| 2016/0313654 A1* | 10/2016 | Zeng | G01B 11/24 |
| 2017/0059999 A1* | 3/2017 | Van Der Schaar | G01N 21/47 |
| 2017/0097575 A1* | 4/2017 | Pandey | G03F 7/70625 |
| 2017/0109646 A1* | 4/2017 | David | G03F 7/70633 |
| 2017/0307983 A1* | 10/2017 | Den Boef | G03F 7/70633 |
| 2018/0047646 A1* | 2/2018 | Bringoltz | G03F 7/70616 |
| 2018/0088470 A1* | 3/2018 | Bhattacharyya | G03F 7/70641 |
| 2018/0129139 A1* | 5/2018 | Jiang | G03F 7/70508 |
| 2018/0203367 A1* | 7/2018 | Jak | G03F 7/70625 |
| 2018/0216930 A1* | 8/2018 | Ur-Rehman | G03F 7/705 |
| 2018/0284624 A1* | 10/2018 | Ausschnitt | G03F 7/70641 |
| 2019/0086200 A1* | 3/2019 | Amit | G01B 11/272 |
| 2019/0094703 A1* | 3/2019 | Jak | G03F 7/70575 |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2011/012624 A1 | 2/2011 |
| WO | WO 2016/083076 A1 | 6/2016 |
| WO | WO 2016/169901 A1 | 10/2016 |
| WO | WO 2016/177548 A1 | 11/2016 |
| WO | WO 2017/029110 A1 | 2/2017 |
| WO | WO 2017/055072 A1 | 4/2017 |

* cited by examiner

METROLOGY METHOD, APPARATUS, AND COMPUTER PROGRAM TO DETERMINE A REPRESENTATIVE SENSITIVITY COEFFICIENT

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay (undesired misalignment of two layers).

Overlay can be determined from a target according to an assumed linear relationship between overlay and intensity asymmetry, i.e., based on a relationship or sensitivity constant K. However, this relationship is only linear for perfect targets for which the only target asymmetry is the overlay being measured and any intentional bias. For real targets, comprising physical imperfections resulting in additional asymmetries, this sensitivity constant K may vary from target to target.

SUMMARY OF THE INVENTION

It would be desirable to be able to perform overlay metrology with increased accuracy.

The invention in a first aspect provides a method of determining a characteristic of a target on a substrate comprising: obtaining a plurality of intensity asymmetry measurements, each intensity asymmetry measurement relating to a target formed on the substrate; determining a sensitivity coefficient corresponding to each target, from the plurality of intensity asymmetry measurements; determining, from the sensitivity coefficients determined in the previous step, a representative sensitivity coefficient for said plurality of targets or a subset greater than one thereof; and determining said characteristic of the target using said representative sensitivity coefficient.

The invention in a second aspect provides a metrology apparatus comprising: an illumination system configured to illuminate with radiation a target; a detection system configured to detect scattered radiation arising from illumination of the target; wherein said metrology apparatus is operable to perform the method of the first aspect.

The invention further provides a computer program comprising processor readable instructions which, when run on suitable processor controlled apparatus, cause the processor controlled apparatus to perform the method of the first aspect, and a computer program carrier comprising such a computer program.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

Figure 1:
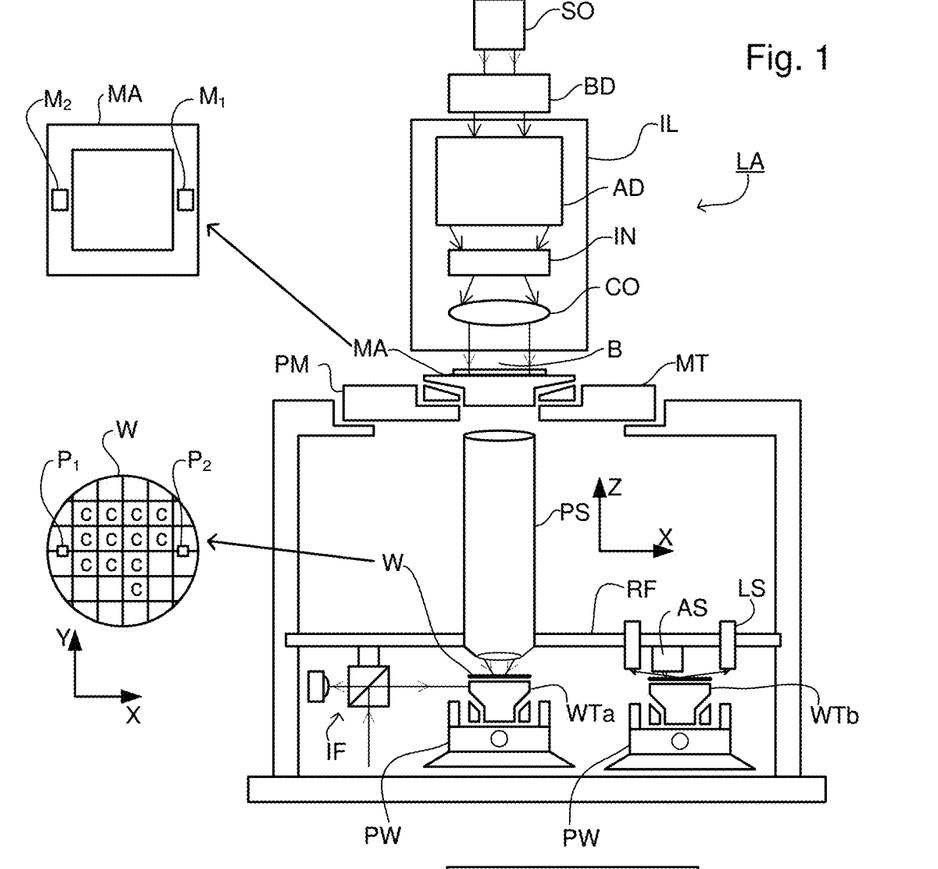
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
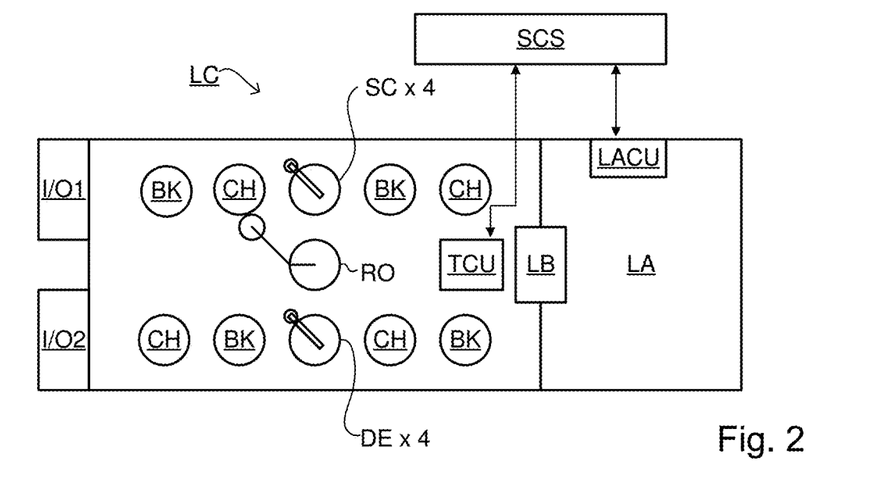
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
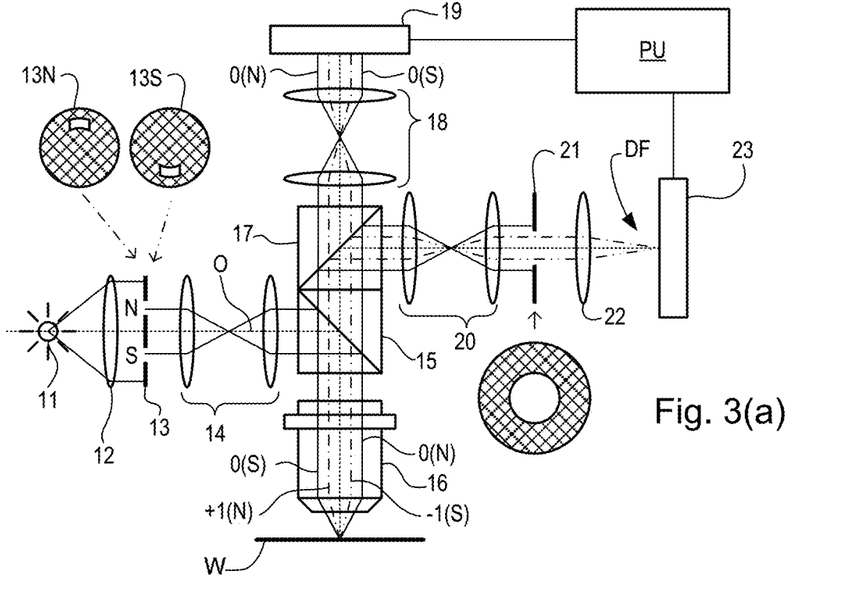
FIGS. 3(a)-3(d) comprise 3(a) a schematic diagram of a dark field scatterometer for use in measuring targets using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 3B:
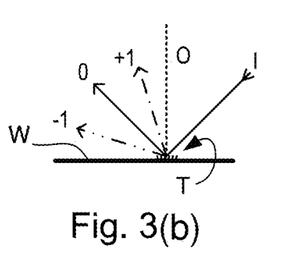

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, with optical wedges (or other suitable elements) in the detection branch to separate the orders for imaging. In yet other embodiments, $2^{nd}$, $3^{rd}$ and higher order beams (not shown in FIG. 3) can be used in measurements, instead of or in addition to the first order beams.

Figure 3C:
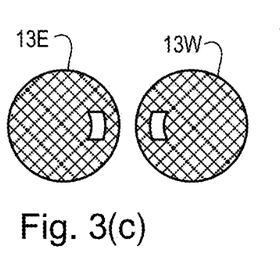
Figure 3D:
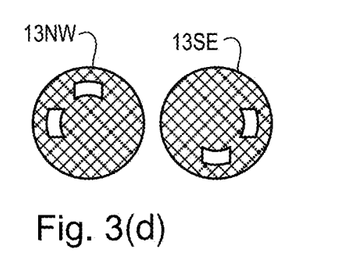

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

Figure 4:
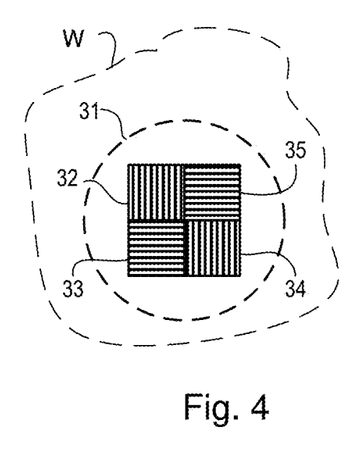
FIG. 4 depicts a known form of multiple grating target and an outline of a measurement spot on a substrate.

FIG. 4 depicts an overlay target or composite overlay target formed on a substrate according to known practice. The overlay target in this example comprises four sub-targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semi-conductor device formed on substrate W. Sub-targets 32 to 35 may have differently biased overlay offsets in order to facilitate measurement of overlay between the layers in which the different parts of the composite sub-targets are formed. The meaning of overlay bias will be explained below with reference to FIG. 7. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

Figure 5:
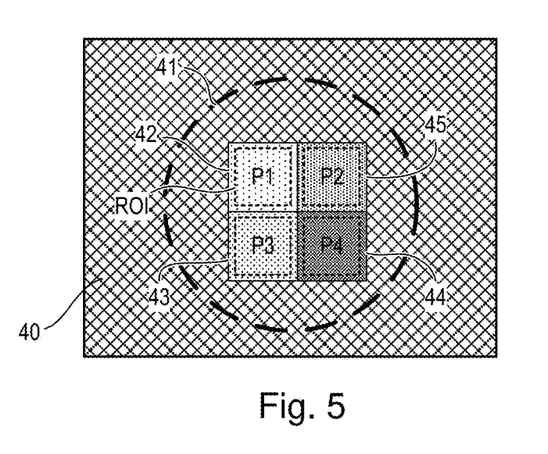
FIG. 5 depicts an image of the target of FIG. 4 obtained in the scatterometer of FIG. 3.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
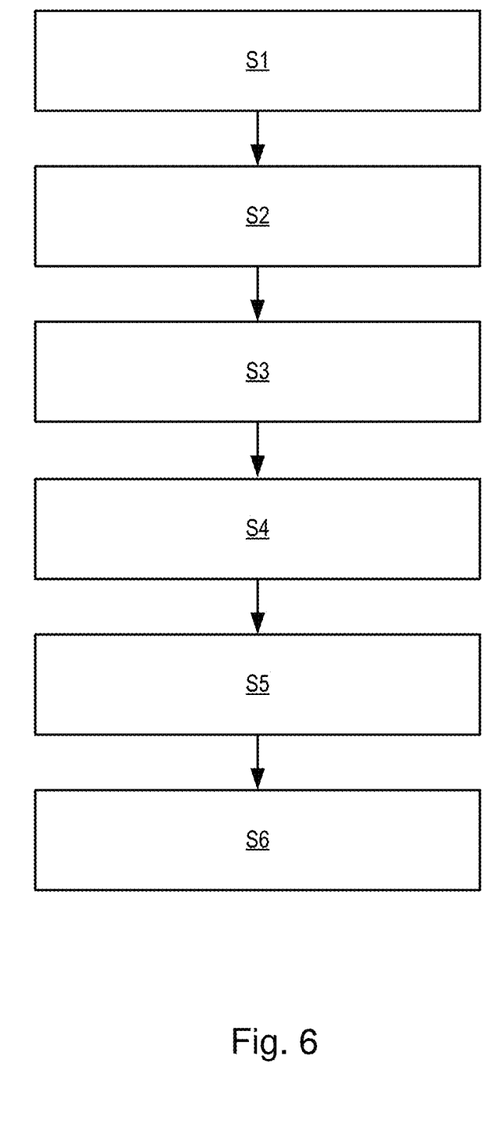
FIG. 6 is a flowchart showing the steps of an overlay measurement method using the scatterometer of FIG. 3.

FIG. 6 illustrates how, using for example the method described in application WO 2011/012624, overlay error (i.e., undesired and unintentional overlay misalignment) between the two layers containing the sub-targets 32 to 35 is measured. Such a method may be referred to as micro diffraction based overlay (μDBO). This measurement is done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create an overlay target including the sub-targets 32-35. At S2, using the metrology apparatus of FIG. 3, an image of the sub-targets 32 to 35 is obtained using only one of the first order diffracted beams (say −1). At step S3, whether by changing the illumination mode, or changing the imaging mode, or by rotating substrate W by 180° in the field of view of the metrology apparatus, a second image of the overlay targets using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual overlay target lines of the overlay targets will not be resolved. Each overlay target will be represented simply by an area of a certain intensity level. In step S4, a region of interest (ROI) is identified within the image of each component overlay target, from which intensity levels will be measured.

Having identified the ROI for each individual overlay target and measured its intensity, the asymmetry of the overlay target, and hence overlay error, can then be determined. This is done (e.g., by the processor PU) in step S5 comparing the intensity values obtained for +1 and −1 orders for each sub-target 32-35 to identify their intensity asymmetry, e.g., any difference in their intensity. The term "difference" is not intended to refer only to subtraction. Differences may be calculated in ratio form. In step S6 the measured intensity asymmetries for a number of overlay targets are used, together with knowledge of any known imposed overlay biases of those overlay targets, to calculate one or more performance parameters of the lithographic process in the vicinity of the overlay target T. A performance parameter of great interest is overlay.

A current overlay calculation method relies on the two sub-target (or two-pad) target (e.g., per direction) such as that illustrated in FIG. 4, with overlay OV being determined via the following equation:

$$OV = \frac{p}{2\pi}\tan^{-1}\left(\tan\left(\frac{2\pi d}{p}\right)\left(\frac{(I_{+d}^{+1} - I_{+d}^{-1}) + (I_{-d}^{+1} - I_{-d}^{-1})}{(I_{+d}^{+1} - I_{+d}^{-1}) - (I_{-d}^{+1} - I_{-d}^{-1})}\right)\right) \quad \text{(Equation 1)}$$

where:
$I_{+d}^{+1}$ is the +1$^{st}$ diffraction order from positive bias target (e.g., intensity value);
$I_{+d}^{-1}$ is the −1$^{st}$ diffraction order from positive bias target;
$I_{-d}^{+1}$ is the +1$^{st}$ diffraction order from negative bias target;
$I_{-d}^{-1}$ is the −1$^{st}$ diffraction order from negative bias target;
$A_{+d} = I_{+d}^{+1} - I_{+d}^{-1}$; (e.g., asymmetry in the +1$^{st}$ and −1$^{st}$ intensities from positive bias target); and
$A_{-d} = I_{-d}^{+1} - I_{-d}^{-1}$, (e.g., asymmetry in the +1$^{st}$ and −1$^{st}$ intensities from negative bias target).

Equation 1 can be reformulated in terms of a sensitivity coefficient K which is a stack dependent parameter having the special property of being overlay independent (assuming a perfect target):

$$A_{+d} + A_{-d} = K \cdot OV \quad \text{(Equation 2)}$$

where:

$$K = \frac{A_{+d} - A_{-d}}{d} \quad \text{(Equation 3)}$$

However, the assumption of a perfect target results in errors in the overlay calculation as targets are not perfect in reality. Targets are typically designed to be structurally symmetrical, except for the imposed bias (i.e., the gratings in each layer are each designed to be structurally symmetrical). However, each target will invariably comprise some structural asymmetry other than the imposed biases. For example, asymmetry (e.g., resultant from an undesigned floor tilt, side wall angle, or height difference) in the lowermost or bottom grating of a target structure is a common form of structural asymmetry. Structural asymmetry may originate for example in wafer processing steps such as chemical-mechanical polishing (CMP), performed after the bottom grating was originally formed.

The result of target imperfections such as structural asymmetry is that the sensitivity coefficient K is affected, and therefore varies from target-to target across a substrate. However, it is proposed that there should exist a representative sensitivity coefficient K* which is not target dependent. Therefore a method is proposed for determining such representative sensitivity coefficient K*, either for all targets of a substrate, or a subset (greater than one) thereof. More specifically, the determination of a representative sensitivity coefficient K* may comprise a determination of a representative sensitivity coefficient function K*(λ), often referred to as a swing curve.

Figure 7:
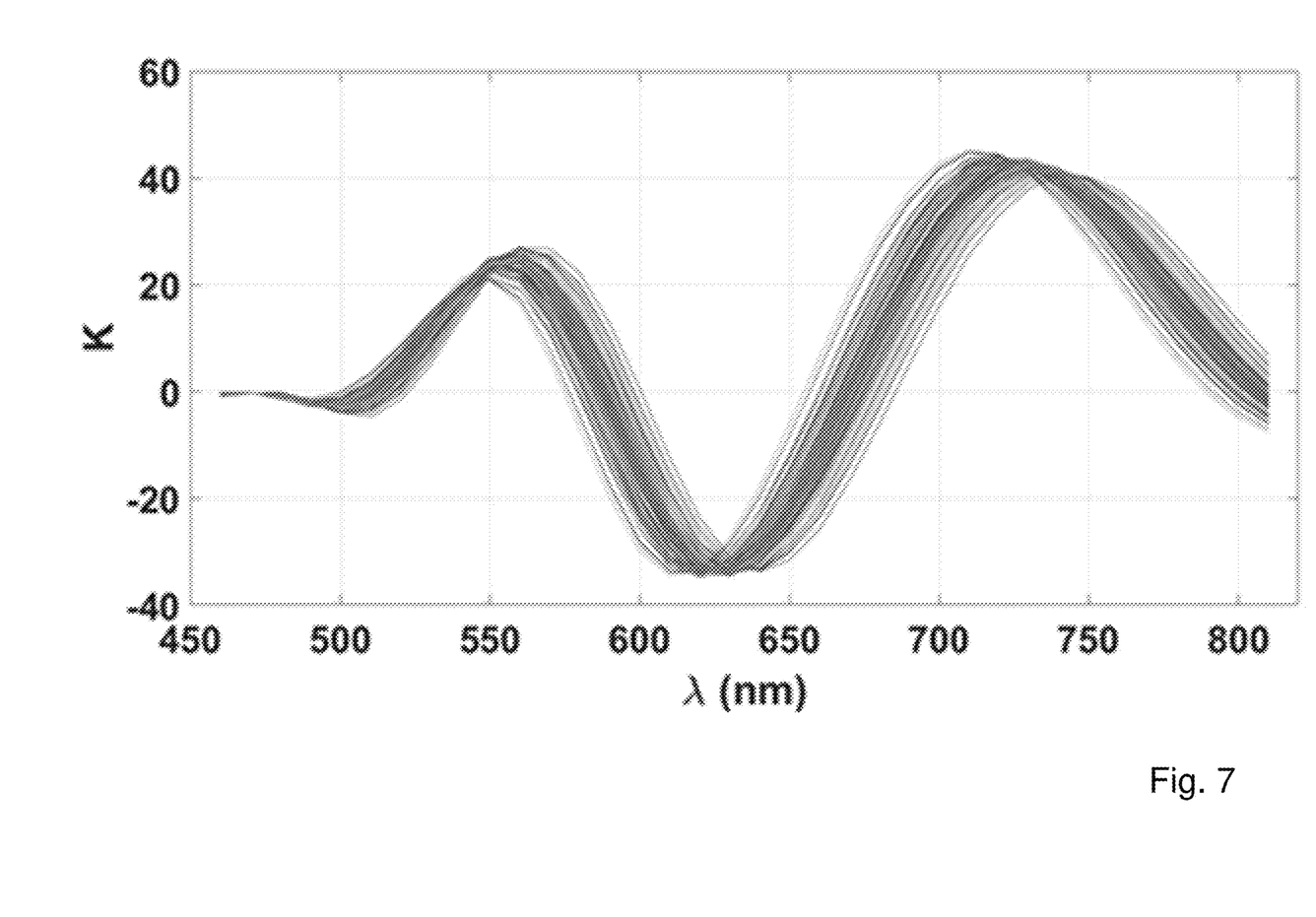
FIG. 7 is a swing curve plot of K against wavelength for a plurality of targets in a substrate.

FIG. 7 is a plot of sensitivity coefficient K against wavelength λ for all the targets on a substrate (i.e., each curve is a separate swing curve relating to a particular target. In the absence of target imperfections, there would only be a single swing curve which would be identical for all of the targets. However, it can be seen that the effect of structural asymmetry in each of the targets is that the swing curve K(λ) varies from target-to-target. This means that, for a given wavelength, the sensitivity coefficient K may be quite different for one target compared to another. Despite this, it should also be apparent that there is a clear trend, target-to-target, over the wavelength range. It is proposed that a representative sensitivity coefficient function K*(λ) be determined based on this trend. Based on this, the estimation of sensitivity coefficient K can be improved by using a representative sensitivity coefficient K* which is more immune to target imperfections, and used in overlay calculations, thereby resulting in improved overlay accuracy. A representative sensitivity coefficient function K*(λ) may be determined for all targets of a substrate, or for subsets thereof; e.g., per region (for example an outer (edge) substrate region and an inner substrate region, possibly extended to include one or more intermediate regions).

A number of different methods are proposed for determining a representative sensitivity coefficient K*. In one embodiment, this may comprise taking the median value of the measured sensitivity coefficient K as determined for all targets within a field of measurement (e.g., per region or substrate). Where multiple wavelengths are available, a representative sensitivity coefficient function K*(λ) may be determined as a regression through these median values, determined per wavelength. Optionally, such a method may be refined by discounting wavelengths for which there is the greatest target-to-target variation in the representative sensitivity coefficient K* (e.g., only including those wavelengths with minimal K variation, or a variation below a threshold variation measure).

Figure 8:
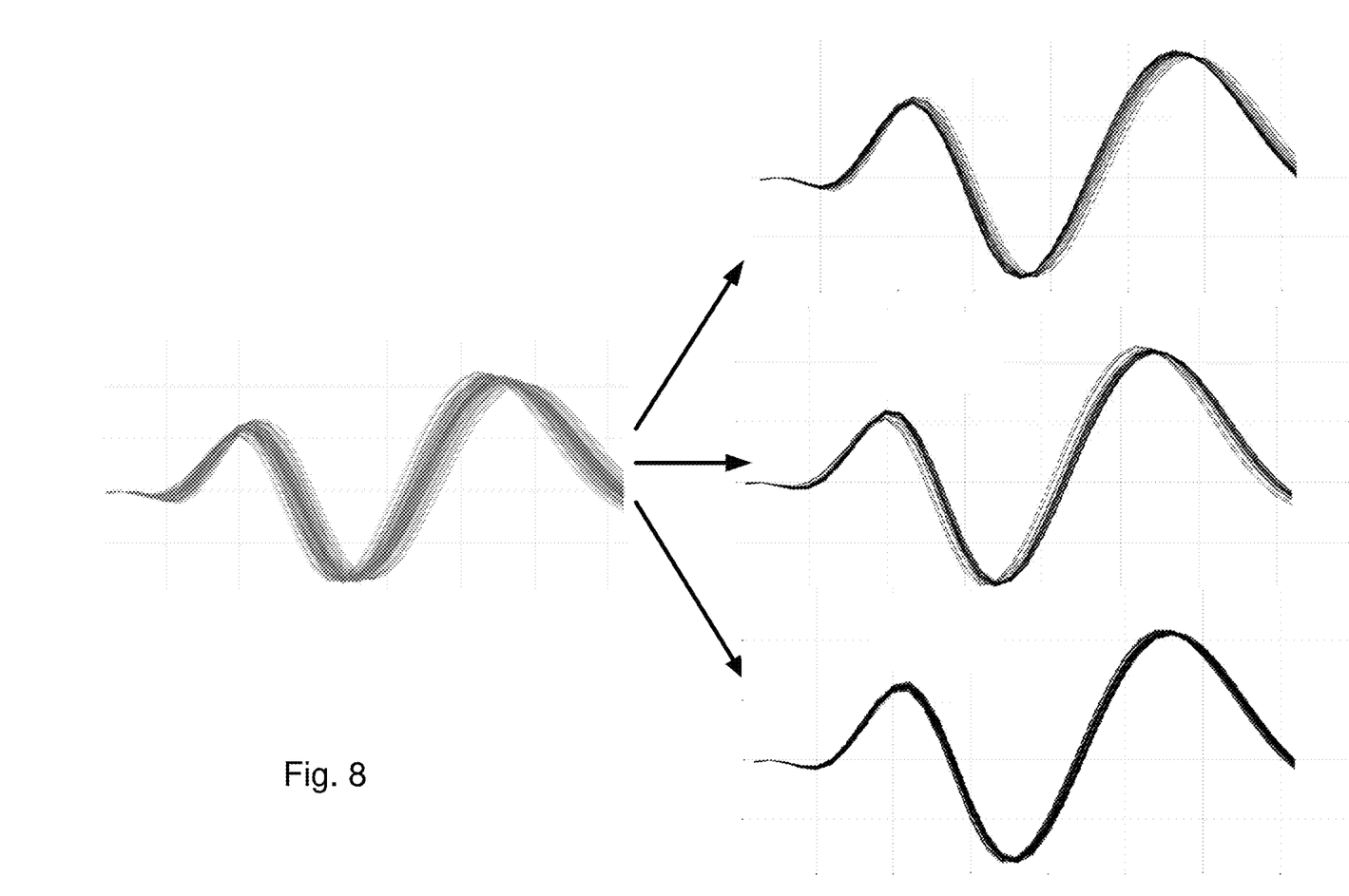
FIG. 8 illustrates a step of clustering the swing curves shown in FIG. 7.

FIG. 8 illustrates another method may use a machine learning technique to cluster or categorize the representative sensitivity coefficient functions K*(λ), as determined per target. It shows the same plot as FIG. 7 (left), clustered into three clusters. A representative sensitivity coefficient function K*(λ) can then be determined per-cluster, or for only one cluster and applied globally. The representative sensitivity coefficient function K*(λ) may be determined using median values for the cluster as already described. The machine learning technique may comprise a k-means or Gaussian mixture models technique. The number of clusters selected may be determined on a process dependent basis, or an arbitrary number (such as any number between 2 and 5) may be chosen. Dimensionality reduction techniques such as principal component analysis (PCA) can also be used to determine the optimal number of clusters, which can then be used by the clustering algorithm.

A representative sensitivity coefficient function K*(λ) can be determined globally for the whole substrate based upon the sensitivity coefficient function K*(λ) determined for a specific cluster. This specific cluster may be, for example, a cluster representing targets of a central region a substrate (it has been observed that clustering tends to result in groups clustered according to target region), as this is where target imperfections are less likely to be an issue. Using only a single representative sensitivity coefficient function K*(λ) per substrate may be preferred if the clustering results in radially symmetric clustering (e.g., clustering on the basis of central region vs. outer region (and one or more intermediate rings if the number of clusters is more than 2). If the clustering does not show such a tendency, then the determination and application of a representative sensitivity coefficient function K*(λ) per cluster may be preferred.

Once a representative sensitivity coefficient K* has been determined, overlay can be then estimated using linear regression through wavelength-dependent points (e.g., n wavelengths $\lambda_1$ to $\lambda_n$) of a plot of $A_{+d}+A_{-d}$ against representative sensitivity coefficient K*; e.g., according to Equation 2, which, in a matrix representation, becomes:

$$\underbrace{\begin{bmatrix} A_{+d}(\lambda_1) + A_{-d}(\lambda_1) \\ \vdots \\ A_{+d}(\lambda_n) + A_{-d}(\lambda_n) \end{bmatrix}}_{Y} = \underbrace{\begin{bmatrix} K^*_{\lambda_1} \\ \vdots \\ K^*_{\lambda_n} \end{bmatrix}}_{X} \cdot OV + e \quad \text{Equation 4}$$

which can be solved for overlay OV by:

$$OV = (X^T X)^{-1} XY \quad \text{Equation 5}$$

where $X^T$ is the transpose of X.

Although one of the advantages of the above method is that it utilizes all data from both sub-targets, the method can be extended to measurements of targets having only a single sub-target (e.g., per direction). Such a method may comprise determined from the slope of a linear fit of a plot of $A_{+d}$ or $A_{-d}$ (e.g., depending on the bias of the single sub-target) against the representative sensitivity coefficient K*. As such, Equation 4 would be amended slightly such that each row in matrix Y has only a single term $A_{+d}(\lambda_1)$ or $A_{-d}(\lambda_1)$.

Figure 9:
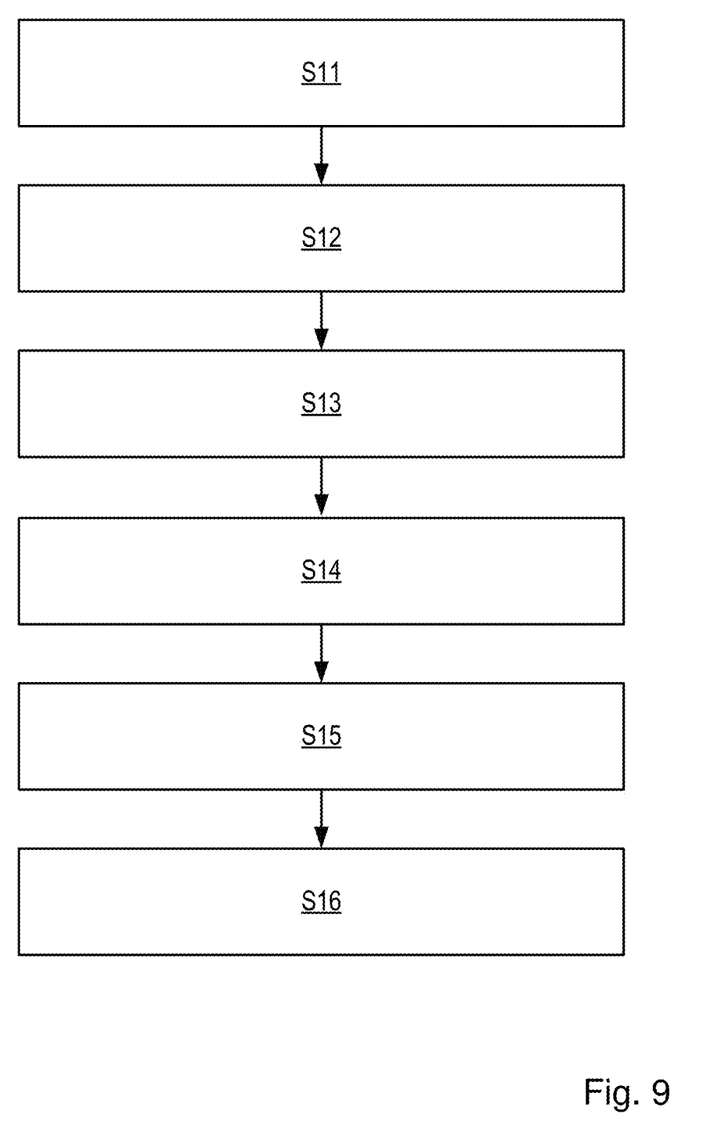
FIG. 9 is a flowchart describing a method of determining overlay according to an embodiment of the invention.

FIG. 9 is a flowchart of an exemplary method of measuring overlay using the techniques described herein. At step S11, the substrate, for example a semiconductor wafer, is processed through a lithographic apparatus, such as the lithographic cell of FIG. 2, one or more times, to create a plurality of overlay targets across the substrate (e.g., located strategically according to a sampling scheme). At S12, using the metrology apparatus of e.g., FIG. 3(a), a first (normal) image of the overlay targets is obtained using first (multi-wavelength) radiation which comprises only one of the first/higher order diffracted beams (e.g., +1). At step S13, a second (complementary) image of the overlay targets using second (multi-wavelength) radiation which comprises the other first/higher order diffracted beam (e.g., -1) is obtained. Steps S12 and S13 may be performed simultaneously (e.g., by using optical wedges to separate the diffracted orders). Steps S11-S13 correspond to steps S1 to S3 of FIG. 6.

At step S14, intensity values from the images obtained at steps S12 and S13 measurements are used to determine a swing curve or sensitivity coefficient function K(λ) for each of the targets.

At step S15, at least one representative swing curve or sensitivity coefficient function K*(λ) is determined from the swing curves of step S14. A representative swing curve may be determined for the whole substrate or for only a subset of the targets (e.g., per region). This step may use a clustering or other machine learning technique and/or determine a regression through median values, as described.

At step S16, the overlay is determined using the (at least one) representative swing curve or sensitivity coefficient function K*(λ). In an embodiment, the overlay may be determined from Equation 4/Equation 5.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps S14-S16 and so calculate overlay error.

The program may optionally be arranged to control the optical system, substrate support and the like to perform the steps S12-S15 for measurement of asymmetry on a suitable plurality of targets.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the invention are described in below numbered clauses:

1. A method of determining a characteristic of a target on a substrate comprising:

obtaining a plurality of intensity asymmetry measurements, each intensity asymmetry measurement relating to a target formed on the substrate;

determining a sensitivity coefficient corresponding to each target, from the plurality of intensity asymmetry measurements;

determining, from the sensitivity coefficients determined in the previous step, a representative sensitivity coefficient for said plurality of targets or a subset greater than one thereof; and determining said characteristic of the target using said representative sensitivity coefficient.

2. A method of clause 1, wherein said characteristic of the target comprises overlay.

3. A method of clause 1 or 2, wherein the sensitivity coefficient describes a proportionality constant relating overlay to intensity asymmetry.

4. A method of clause 1, 2 or 3, comprising determining said characteristic for said plurality of targets using said representative sensitivity coefficient for each target.

5. A method of clause 1, 2 or 3, comprising determining said characteristic for a subset of the plurality of targets using said representative sensitivity coefficient for each target of said subset.

6. A method of any preceding clauses, wherein determining a representative sensitivity coefficient comprises determining a median value of the sensitivity coefficients of the plurality of targets.

7. A method of any preceding clauses, wherein said plurality of intensity asymmetry measurements are performed using radiation having a plurality of different illumination characteristics.

8. A method of clause 7, wherein the plurality of different illumination characteristics comprise a plurality of different wavelengths and/or polarizations.

9. A method of clause 7 or 8 wherein said determining a sensitivity coefficient corresponding to each target comprises determining an illumination-characteristic-dependent sensitivity coefficient function for each target; and said determining a representative sensitivity coefficient comprises determining a representative illumination-characteristic-dependent sensitivity coefficient function.

10. A method of clause 9, comprises performing a machine learning process to categorize the illumination-characteristic-dependent sensitivity coefficient functions into groups.

11. A method of clause 10, wherein the machine learning process is a clustering process.

12. A method of clause 10 or 11, comprising determining a single representative illumination-characteristic-dependent sensitivity coefficient function from a single one of said groups, for use in determining the characteristic of the target for all of said plurality of targets.

13. A method of clause 10 or 11, comprising determining a group representative illumination-characteristic-dependent sensitivity coefficient function for each of said groups.

14. A method of any of clauses 9 to 13, wherein determining a representative illumination-characteristic-dependent sensitivity coefficient function for said plurality of targets and/or one or more of said groups comprises regressing through median values of the sensitivity coefficients corresponding to the plurality of targets or appropriate group, at each illumination characteristic.

15. A method of any preceding clauses, wherein said target comprises a first sub-target with a first bias and a second sub-target with a second bias, and said step of determining said characteristic of the target comprises using a combination of asymmetry measurements from both of said first sub-target and second sub-target.

16. A method of any of clauses 1 to 14, wherein said target comprises a single sub-target.

17. A metrology apparatus comprising:

an illumination system configured to illuminate with radiation a target; and a detection system configured to detect scattered radiation arising from illumination of the target;

wherein said metrology apparatus is operable to perform the method of any of clauses 1 to 16.

18. A computer program comprising processor readable instructions which, when run on suitable processor controlled apparatus, cause the processor controlled apparatus to perform the method of any one of clauses 1 to 16.

19. A computer program carrier comprising the computer program of clause 18.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining a performance parameter of a lithographic process, the method comprising:

obtaining intensity asymmetry measurements each relating to a target in a plurality of targets formed on a substrate;

determining sensitivity coefficients corresponding to each target based on the intensity asymmetry measurements; and determining, from the sensitivity coefficients, a representative sensitivity coefficient for the plurality of targets or a subset greater than one thereof, wherein the determining the performance parameter is based on the representative sensitivity coefficient, and wherein the determining a representative sensitivity coefficient comprises performing a machine learning process to cluster or categorize the sensitivity coefficients of each target.

2. The method of claim 1, wherein the determining the performance parameter comprises determining overlay.

3. The method of claim 1, wherein the sensitivity coefficient comprises a proportionality constant relating overlay to intensity asymmetry.

4. The method of claim 1, further comprising determining the performance parameter using the representative sensitivity coefficient for each target.

5. The method of claim 1, further comprising determining the performance parameter for a subset of the plurality of targets using the representative sensitivity coefficient for each target of the subset.

6. The method of claim 1, wherein the determining a representative sensitivity coefficient comprises determining a median value of the sensitivity coefficients of the plurality of targets.

7. The method of claim 1, wherein the plurality of intensity asymmetry measurements are performed using radiation having a plurality of different illumination characteristics.

8. The method of claim 7, wherein the plurality of different illumination characteristics comprises using a plurality of different wavelengths and/or polarizations.

9. The method of claim 7, wherein:
the determining a sensitivity coefficient corresponding to each target comprises determining an illumination-characteristic-dependent sensitivity coefficient function for each target; and
the determining a representative sensitivity coefficient comprises determining a representative illumination-characteristic-dependent sensitivity coefficient function.

10. The method of claim 9, wherein the performing the machine learning process comprises categorizing the illumination-characteristic-dependent sensitivity coefficient functions into groups.

11. The method of claim 10, wherein the performing the machine learning process comprises a clustering process.

12. The method of claim 10, further comprising determining a single representative illumination-characteristic-dependent sensitivity coefficient function from a single one of the groups for use in determining the performance parameter for all of the plurality of targets.

13. The method of claim 10, further comprising determining a group representative illumination-characteristic-dependent sensitivity coefficient function for each of the groups.

14. The method of claim 9, wherein the determining a representative illumination-characteristic-dependent sensitivity coefficient function for the plurality of targets and/or one or more of the groups comprises regressing through median values of the sensitivity coefficients corresponding to the plurality of targets or appropriate group, at each illumination characteristic.

15. The method of claim 1, wherein:
the target comprises a first sub-target with a first bias and a second sub-target with a second bias, and
the determining the characteristic of the target comprises using a combination of asymmetry measurements from both of the first sub-target and second sub-target.

16. The method of claim 1, wherein the target comprises a single sub-target.

17. A metrology apparatus comprising:
an illumination system configured to illuminate a target with radiation; and
a detection system configured to detect scattered radiation arising from the illumination of the target,
wherein the metrology apparatus is configured to:
obtain intensity asymmetry measurements each relating to the target in a plurality of targets formed on a substrate;
determine sensitivity coefficients corresponding to each target based on the intensity asymmetry measurements; and
determine, from the sensitivity coefficients, a representative sensitivity coefficient for the plurality of targets or a subset greater than one thereof,
wherein the determining the performance parameter is based on the representative sensitivity coefficient, and
wherein the determined representative sensitivity coefficient is based on a cluster or a categorization of the sensitivity coefficients of each target from a machine learning process.

18. A computer program product for determining a performance parameter of a lithographic process, the computer program product comprising:
one or more non-transitory computer-readable storage devices having stored thereon computer executable instructions that when executed cause at least one processor to:
obtain intensity asymmetry measurements each relating to a target in a plurality of targets formed on a substrate;
determine sensitivity coefficients corresponding to each target based on the intensity asymmetry measurements; and
determine, from the sensitivity coefficients, a representative sensitivity coefficient for the plurality of targets or a subset greater than one thereof,
wherein the determining the performance parameter is based on the representative sensitivity coefficient, and
wherein the determined representative sensitivity coefficient is based on a cluster or a categorization of the sensitivity coefficients of each target from a machine learning process.

19. A computer program carrier comprising the computer program product of claim 18.

* * * * *